United States Patent [19]

Reinhardt

[11] Patent Number: 5,055,748
[45] Date of Patent: Oct. 8, 1991

[54] TRIGGER FOR PSEUDOSPARK THYRATRON SWITCH

[75] Inventor: Nicholas Reinhardt, Lexington, Mass.

[73] Assignee: Integrated Applied Physics Inc., Pasadena, Calif.

[21] Appl. No.: 530,205

[22] Filed: May 30, 1990

[51] Int. Cl.$^5$ ............................................. H05B 37/00
[52] U.S. Cl. .................................. 315/335; 315/330; 313/590
[58] Field of Search ............... 315/335, 334, 330, 326, 315/5; 313/590–592, 596, 597, 599, 538; 307/106, 108

[56] References Cited

U.S. PATENT DOCUMENTS

| | | | |
|---|---|---|---|
| 3,065,371 | 11/1962 | Stutsman | 313/392 |
| 3,165,660 | 1/1965 | Menown | 313/592 |
| 4,180,756 | 12/1979 | Wheldon | 313/592 |
| 4,335,465 | 6/1982 | Christiansen | 313/599 |
| 4,370,597 | 1/1983 | Weiner | 307/108 |
| 4,604,554 | 8/1986 | Wootton | 315/330 |
| 4,890,040 | 12/1989 | Gunderson | 315/156 |

Primary Examiner—Eugene R. LaRoche
Assistant Examiner—Amir Zarabian
Attorney, Agent, or Firm—Kenway & Crowley

[57] ABSTRACT

The present invention concerns a method for triggering certain high voltage electronic, gas discharge switches that are a novel type of high power thyratron. In this invention, triggering of switches of the so-called "pseudospark thyratron" type (a type of cold cathode thyratron) is enhanced by the inclusion of a very small, hot thermiionic trigger switch or cathode, separate and isolated from the main switch electrodes, to initiate the triggering discharge. The trigger cathode is protected from destruction by the main discharge current through the switch by mechanically and electrically isolating it from further participation in the discharge once the triggering process has been initiated.

17 Claims, 2 Drawing Sheets

TRIGGER FOR PSEUDOSPARK THYRATRON SWITCH

BACKGROUND OF THE INVENTION

Thyratron switches are used to switch energy stored in capacitors or pulse forming networks in order to drive high voltage pulse power devices such as pulse generators, lasers, radar transmitters, and particle accelerators. The so-called pseudospark and back-lighted thyratron (BLT) switch, a novel type of switch recently developed in both Europe and America, has, for many typical switching applications, required elaborate triggering means to achieve the desired switching characteristics. Some of these means involve unacceptable complications in switch support circuitry for what is intended to be an easily-applied, commercial device; others employ triggering devices which are incompatible with inclusion in a hermetically-sealed device.

Triggering refers to the process of closing the thyratron switch by initiating the electrical discharge in the switch so that the switch conducts current. In the present instance, triggering refers to closing a type of electronic switch comprised of two (or sometimes more) electrodes in an evacuated envelope filled with a low pressure gas for supplying electrons and ions. Specifically, for the purpose of describing this invention, it relates to a switch called a "pseudospark" switch, which refers to an electrically-triggered version of the switch. A "back-lighted thyratron," switch refers to an optically-triggered version of this switch. The invention concerns an electronic trigger that simplifies and improves the triggering method for the pseudospark device.

Switches of pseudospark or back-lighted type can be triggered in several different ways, and it is true that, once triggered, these switches conduct with short delay and little jitter. The problem, however, is (in common with other "cold-cathode" devices) that long and erratic breakdown delay times and excessive "high impulse ratio" trigger breakdown voltages may be encountered when establishing the trigger discharge itself in the first place.

In the absence of a heated thermionic cathode or other copious source of electrons, there may be relatively few electrons emitted or favorably placed prior to trigger breakdown to cause a triggering discharge of the desired characteristics to take place. Therefore, to meet the often simultaneous and conflicting requirements for short delay, low jitter, long life, and reasonable triggering requirements, some enhancement of the cold cathode switch triggering arrangements is generally necessary, particularly where the new pseudospark approach is intended to retrofit an application originally served by a hot cathode tube.

Many triggering methods and circuit variations have been devised to improve pseudospark/BLT triggering performance. A review is presented in "High Power Hollow Electrode Thyratron-Type Switches," K. Frank, E. Boggasch, J. Christiansen, A. Goertler, W. Hartmann, C. Kozlik, G. Kirkman, G. Braun, V. Dominic, M. A. Gundersen, H. Riege and G. Mechtersheimer, IEEE Tans. Plasma Science, published in 1988. The methods described for triggering include a pulsed-glow discharge or charge injection trigger, and a slide-spark (surface-discharge) trigger. These triggering methods, which are those used in the pseudospark switch, are also described in the article "High Power Hollow Electrode Thyratron-Type Switches," by the same authors in the Proceedings, Sixth IEEE Pulse Power Conference, June 1987. These articles present reviews of the state of the art.

Additional descriptions of trigger methods are contained in the articles J. Christiansen and Ch. Schultheiss, "Production of High Current Particle Beams by Low Pressure Spark Discharges," Zeitschrift for Physik A290, 35 (1979); D. Bloess, I. Kamber, H. Riege, G. Bittner, V. Brückner, J. Christiansen, K. Frank, W. Hatmann, N. Lieser, Ch. Schultheiss, R. Seeböck, and W. Steudtner, Nuclear Instr. & Methods 205, 173 (1983); E. Boggasch, H. Riege, and V. Brückner, "A 400 kA Pulse Generator with Pseudospark Switches," European Organization for Nuclear Research (CERN/PS/85-30(AA)), Geneva, Switzerland, July 1985; K. Frank, E. Boggasch, J. Christiansen, A. Goertler, W. Hartmann and C. Kozlik, "High Repetition Rate Pseudospark Switches for Laser Application," Proceedings of SPIE 735, Pulse Power for Lasers, 74, 1987. See also G. Mechtersheimer and R. Kohler, "Multichannel Pseudospark Switch (MUPS)" J. Physics E: Sci. Instrum. 20, 270 (1987). A patent that is related to the prior art is U.S. Pat. No. 4,335,465, 6/982, J. Christiansen and C. Schultheiss.

As will be appreciated by those who are familiar with triggered gas discharge devices, however, the triggering methods so far described are either complex and cumbersome, or if simple, fail to produce triggering compatible with such factors as repetition rate, energy per pulse, peak current, current rate of rise, pulse to pulse jitter, delay in triggering, life, ability to conduct reverse current, and other operating conditions and requirements affected by or dependent upon triggering. Such factors, either singly or in combination, often constitute the essential limitations in the performance characteristics of the switch in a given application.

For example, attempting to trigger the device with the simple exposed wire electrode used in the first experimental pseudospark devices generally results in unacceptable time delays and jitter due to the long and erratic formative times for the long-path discharge. If triggering is wanted within a microsecond or less, as much as 7 kilovolts may be required to break down a long-path gap that under steady DC conditions will eventually self fire with only 300 or 400 volts applied. And, where a pulse-to-pulse time-jitter of less than a few nanoseconds is wanted, the initial trigger breakdown will often show jitter several hundred times as large. Increasing the tube pressure to obtain better triggering typically degrades short-path high voltage hold off between the main electrodes. Trying to enhance triggering by use of sharp points, low work function metals, high secondary-emission surfaces, dielectric discontinuities, "sparkers" and other techniques used in high pressure spark-gap triggering (i.e. in devices operating on the "right-hand side of the Paschen curve") is of little or no use.

In a similar vein, the use of, say, a mylar spark-slide or flash-board to promote low-pressure breakdown by a surface discharge, while acceptable in an unsealed laboratory prototypes attached to a pump and gas handling apparatus, is completely unacceptable in a sealed-off device, where gas purity must be maintained for thousands of hours during life.

Even the use of optical techniques, for example instantaneous optical triggering by means of ultraviolet-emitting flash-tubes, begs the triggering question somewhat, for delay and jitter associated with the flash lamp itself are then encountered, and resort must be had to delay-reducing stratagems farther back in the trigger circuit, which add further complexity to the trigger chain. One result is undue cost and complexity; another is the impracticality of "stacking" the high voltage switch devices or configuring them in other desired modes; a third is lowering of the overall "power gain" of the switch.

It is, therefore, an object of this invention to obtain triggering of a pseudospark cathode comparable to the relatively simple, generally-satisfactory triggering of hot-cathode thyratron devices without forgoing the numerous advantages of the cold cathode pseudospark or back-lighted switch. These are: essentially zero standby power, short warm up, long life, exceptionally high peak current capability without arcing, a relatively improved ability to isolate stages for the purpose of stacking, and high overall power gain.

SUMMARY OF THE INVENTION

The present invention simplifies triggering through use of an inexpensive, uncomplicated structure suitable for inclusion in a sealed-off gas discharge switch. The present invention produces its triggering effect in a low pressure discharge that is characteristic of the pseudospark and the back-lighted thyratron, as well as for thyratrons in general. These switches achieve high voltage hold-off by operation on the so called "left hand side of the Paschen minimum," i.e. in the region of rapidly rising breakdown voltage for a decreasing product of gas pressure times electrode separation, encountered in most devices close to the attainment of complete vacuum. A feature of such operation is that "short-path breakdowns" occur at much higher voltages than "long-path breakdowns," with the result that the high voltage electrodes of the switch itself are placed closer to each other rather than farther away, to achieve higher hold-off voltage. This is possible at pressures of the order of less than or about equal to or about 15–75 Pa., and typical hold-off voltage under these conditions for operation with hydrogen or helium gas is about 35 kilovolts, with an electrode separation of about 2 to 3 mm.

Such operation is a standard method and is used in modern high power hydrogen thyratrons that have been commercially available for about 40 years. A description of the operation of gas filled thyratrons is contained in the McGraw-Hill Encyclopedia of Science and Engineering Thyratrons can operate with various elemental gases including hydrogen, helium, nitrogen, argon, neon, xenon, and krypton. The pressure of the gases is normally 0.1 to 0.5 torr. The function of the gas is to produce electrons and ions which form what is called a plasma, a state of matter through which very large electrical currents can be conducted. The current that is conducted in a thyratron such as the pseudospark or back-lighted thyratron is higher than that conducted in a normal commercial thyratron, and may range from less than 1000 amperes to as much as 200,000 amperes.

The gas-filled high power electronic switch may be used to transfer energy to a load such as a laser or particle accelerator. A high power energy source is connected to the switch, either the anode or the cathode, and the switch is connected to the load. The energy source is usually a capacitor or a pulse forming network. The trigger closes the switch, which then transfers energy from the source to the load. This aspect of operation is analogous to the function and operation of commercially available thyratrons.

These switches are to be distinguished from spark gaps, in that current in a pseudospark or back-lighted thyratron is normally conducted in a glow discharge mode. This difference is important for many applications, in that the spark gap conduction in an arc mode results in rapid degradation of electrodes, repetition rate limitations caused by arc-produced electrode material appearing between the gaps, and excessive gas supply requirements.

The pseudospark and back-lighted thyratron switches are likewise to be distinguished from conventional thyratrons, in that they are capable of higher current, faster current rise, and other advantages described in the publications referenced above.

To trigger hydrogen or other types of conventional gaseous thyratrons, advantage is taken of the presence of a copious thermionic electron emitter, typically a very large, indirectly-heated cathode capable of emitting the entire current to be switched (hundreds to several thousands of amperes), in a chamber with dimensions somewhat larger than the 2 or 3 millimeters giving best high voltage hold-off between the main electrodes of the switch. By applying a brief positive pulse to a nearby grid or trigger electrode, "long-path" breakdown of the grid cathode space is caused to occur, and a discharge current of a few amperes is caused to flow in a part of the chamber accessible to fields associated with the high voltage electrodes. The resulting electrical disturbance then causes "short-path" breakdown to occur a few tenths of a microsecond later in the high voltage hold-off space between the high voltage electrodes of the switch, thus completing the circuit between cathode and anode and rendering the switch conductive.

Such hot-cathode thyratrons are typically triggered by an easily supplied grid drive of a few hundred volts to several thousand volts through an impedance of several 10's of ohms. These switches typically show short and fairly stable anode delay times (delays of at most a few tenths of a microsecond between triggering and full conduction), limited drifts in anode delay time, and essentially no pulse-to-pulse jitter (tj < 1 ns).

There are numerous disadvantages to this mode of operation, however. The chief disadvantages of the typical thermionic cathode include: extremely slow warm-up, the inability to emit enough electrons to support extremely high switch currents or long pulses without destructive arcing, the consumption of inordinately large amounts of heater power during operating standby, relatively short life compared to other switch components, and the degradation of high voltage hold-off during standby due to the slow evaporation of low work-function material from the hot cathode. In addition, due to the difficulty of isolating the large, high-current filament supplies and other apparatus required, the ability to stack switch devices in series to reach higher voltages is severely limited.

A major objective of the pseudospark or thyratron of the present invention is to get rid of the massive hot thermionic cathode and its associated difficulties, and make best use of the superior properties of the pseudospark cathode, which among other things essentially remains cold during standby operation. Elimination of the hot cathode, however, means that the relatively easy triggering method described above is no longer applicable, and an alternate triggering method must be used.

The triggering discharge, once established, can carry up to several amperes of current in the glow mode, between cold electrodes, by means of the ionized low pressure gas. Experience has shown that once such a trigger discharge has been established, the rest of the pseudospark switch closure takes place with great reliability, and shows adequate delay-time stability and freedom from jitter. Thus, the triggering task reduces to initiating this longpath low pressure discharge in a prompt and jitter-free fashion. This, in turn, requires the assured presence of a sufficient quantity of well placed electrons at the moment triggering is desired. On longer triggering time scales (milliseconds or more) these electrons can be supplied by adding radioactivity to the device, but for triggering on the microsecond and nanosecond time scales, the amounts of radioactivity required would become inordinately large and utterly impractical. Recourse must be made to other sources of electrons, chief among which are thermionic- and photo-emitters. Both kinds of sources are readily available and can easily be adapted to the purpose (and to some extent can be combined). Each has its advantages and disadvantages, with the photo-emissive trigger cathode being primarily applicable to the backlighted thyratron, and the thermionic cathode to the pseudospark switch.

As previously noted, in hot-cathode thyratrons, the job of supplying favorably placed triggering electrons was a useful auxiliary function of the large main cathode, which then proceeded to supply current for the main discharge. In the present invention, this job is taken over by a much smaller thermionic cathode of extremely low power consumption and nearly instantaneous warm-up, whose sole function is to initiate the trigger discharge. This cathode, electrically isolated from the pseudospark switch cathode and anode, is arranged so that the appropriate main electrode can briefly serve as a triggering anode in order to draw a triggering discharge. The triggering discharge is then transferred to the cold electrodes and finally initiates conduction through the switch.

The auxiliary cathode is mechanically and electrically defended against taking further part in the trigger discharge, or in the main discharge that follows, and it is also defended against damage by ion beams by its location in the hollow electrode space, by shielding and baffling, and by optional impedance protection. Baffling and shielding are also used to contain the electrostatic fields from the heater power leads. These fields typically produce power-frequency modulation of the delay time when the heater is operated on AC. When the auxiliary cathode is provided in the form of a filamentary cathode, the cathode must be operated on pure DC or on current whose alternations or fluctuations are synchronized with the pulse repetition rate.

Since the cathode is physically small (a few mm$^2$) and heavily baffled, degradation of the rest of the tube by cathode material evaporated from (the typically hundreds of cm$^2$ of) a normal thyratron cathode becomes much less of a problem.

DETAILED DESCRIPTION

Figure 1:
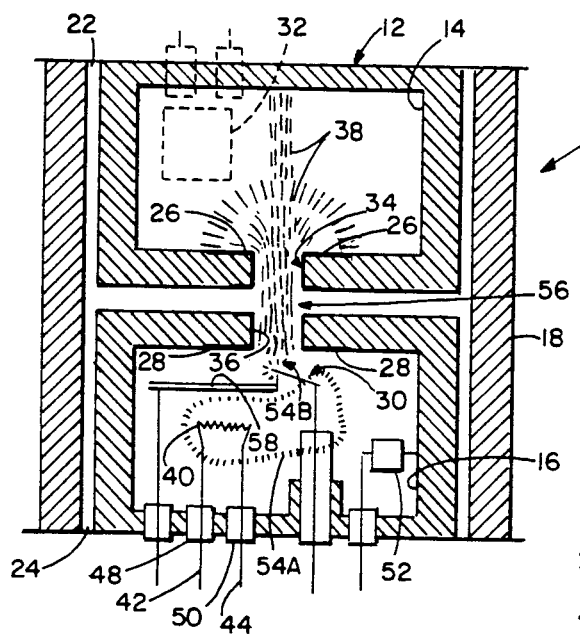
FIG. 1 is cross-sectional schematic diagram of a pseudospark thyratron switch according to the present invention.

A pseudospark thyratron switch 10 according to the present invention is shown in FIG. 1. As depicted therein, the thyratron switch comprises an envelope 12 and a first and second primary electrode, 14, 16. The envelope comprises primary insulator 18 and the space within the envelope is enclosed by sealing members 22, 24 secured to insulator 18. In a presently preferred embodiment, electrode 14 is utilized as the anode and electrode 16 is utilized as the cathode. The active area of the anode is identified at 26 and the active area of the cathode at 28.

A trigger electrode 30 schematically illustrated in FIG. 1 is located a predetermined distance from the cathode. Optionally this trigger electrode 30 could also be located in the vicinity of the anode as shown at 32. The structure and precise positioning of a presently preferred trigger electrode 30 will be discussed in more detail in conjunction with the discussion of FIGS. 2 and 3 below.

The anode 14 and cathode 16 are constructed such that each has an aperture 34, 36 disposed opposite each other and in alignment. As thyratron 10 is triggered into operation an electron beam is produced, followed by the main pseudospark plasma discharge 38 of the thyratron which extends through aperture 34, 36 across active areas 26, 28.

Figure 4:
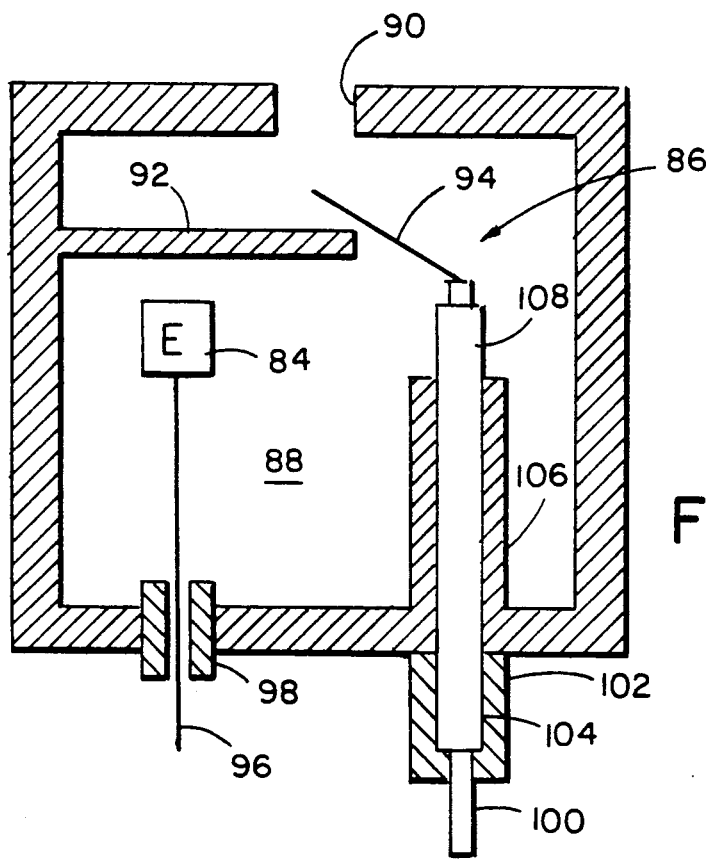
FIG. 4 is a cross-sectional schematic diagram of a presently preferred embodiment of a trigger electrode and auxiliary discharge emitter for firing the thyratron of the present invention.

Trigger electrode 30 is schematically shown in FIG. 1. The specific details of the trigger electrode and its isolating baffle are shown in FIG. 4. Electrical connections to filament 40 are shown at 42, 44 and extend between filament 40 and a source of electric power (filament voltage). The connections 42, 44 and filament 40 are supported by insulators 48, 50. Connections 42, 44 extend through insulators 48, 50 to the exterior of envelope 12.

The envelope 12 of the thyratron is evacuated and then back-filled with an elemental gas such as hydrogen or helium as is indicated elsewhere in this specification. A reservoir 52 of an elemental gas is shown in FIG. 1 and is the source of the gas used to backfill the thyratron of the present invention.

As described in more detail below, a trigger pulse is delivered to trigger electrode 30 which in turn sets up an auxiliary trigger discharge as shown at 54A. Auxiliary discharge 54A causes electrons to be injected by trigger tip discharge 54B though aperture 36 into the space 56 between the anode and the cathode which in turn produces thyratron firing and the creation of the main pseudospark discharge 38. A baffle 58 is schematically shown in FIG. 1. and is positioned so as to shield the aperture 36 of cathode 16 from filament 40 and in turn protect filament 40 from the main thyratron discharge.

Observation and experimentation with the configurational details of the previously described hot cathode enhanced trigger have revealed ways to miniaturize the device, augment favorable modes of operation, and suppress modes associated with delayed or erratic triggering, short life, and destruction of trigger elements. In addition, ways have been found to avoid compromising tube forward hold-off voltage by the presence and activity of the hot filament auxiliary trigger enhancement means. In particular, the combination of hot cathode and controlled surface breakdown has been shown to permit the construction of an extremely compact wire-type trigger than can be operated by a normal thyratron trigger pulse of less than 5 KV open-circuit at 1 ampere and 1 us FWHM.

An experimental prototype of the present invention having dimensions of 17 mm in diameter and 5 mm in height exclusive of supporting structure and connections has been used to create a prompt, stable, and intense jet of plasma capable of reliably triggering the thyratron. The device functions well at normal tube pressures, and shows triggering activity from near-vacuum (10-20 microns) up through several hundred microns. In the typical thyratron environment, actual grid breakdown voltage can be as low as 500-800 volts, delay time can be as low as a few hundred nanoseconds from the start of the trigger pulse; observed jitter is typically less than 2 ns (instrumentation limit). The auxiliary filament power supply requirements are typically 6.3 volts and 0.7 ampere DC. Warm-up time is only a fraction of a second.

Figure 2:
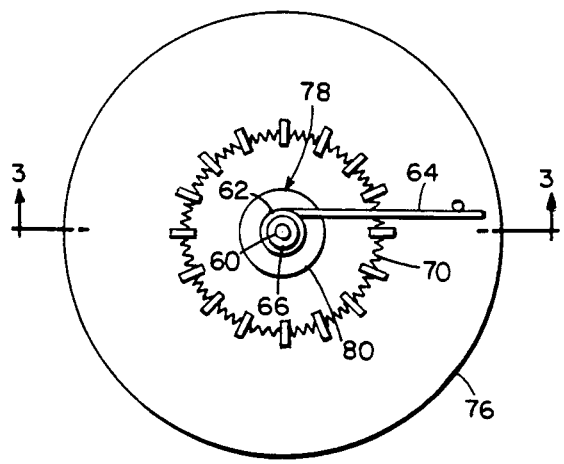
FIG. 2 is a plan view of an auxiliary trigger electrode for firing the thyratron of the present invention.
Figure 3:
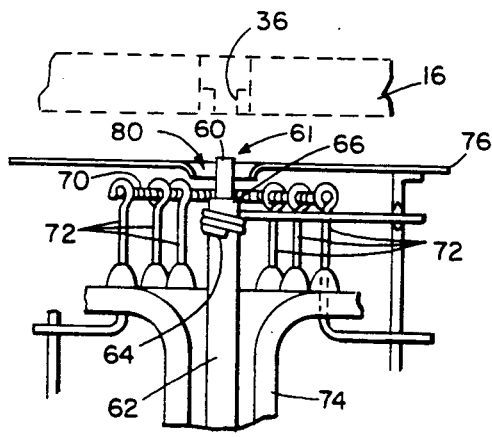
FIG. 3 is a cross-sectional view taken along lines 3—3 of FIG. 2 showing the auxiliary trigger electrode and surrounding filament.

Referring now to FIGS. 2 and 3 an alternate embodiment of the trigger electrode of the present invention is shown. A trigger electrode 61 shown in FIGS. 2 and 3 is more suited for operation at relatively high pressures, in the range of 200 to 350 microns. Trigger electrode 61 (comparable to 30 in FIG. 1) consists of a 1.5 mm diameter wire 60 completely insulated with a surrounding sheath 62 of 2.5 mm OD. ceramic tubing except for the tip, where the bare wire emerges and protrudes 2-3 mm towards the cathode aperture 36. The trigger pulse is applied to wire 60 via a feedthrough in the base of the tube.

Encircling the ceramic sheath in the vicinity of the tip is a grounded electrode 64 made of a damage resistant material for example, tungsten. This electrode is typically tied back to pulse-ground through a protective impedance (not shown) of a few nH. During the trigger pulse, an intense radial electric field is created at the dielectric surface discontinuity 66 between wire 60 and insulating sheath 62 by the well known dielectric field-enhancement effect.

Low-voltage, short-delay, low-jitter flashover of the surface 66 of ceramic sheath 62 is promoted by surrounding the flashover site with a filament 70 coated with active cathode material. This auxiliary cathode has the form of a small (1.5 cm diameter) circle of coiled filament similar to fluorescent lamp filament mechanically supported by an array of individually insulated wires 72 emerging from a glass stem 74. Filament 70 is placed so that light and electrons from it can directly illuminate the junction of the ceramic sheath 62 and wire 60. Power is supplied to filament 70 through pulse protective impedances of a few nH.

Electrons and light from filament 70 are prevented from reaching the main tube electrode cathode hole by a circular baffle 76. Baffle 76 has a central hole 78 8 mm in diameter with a 1 mm lip 80. Through a protective impedance, baffle 76 may be connected directly to electrode 16, or to an auxiliary means for adjusting or pulsing its potential relative to electrode 16 and aperture 36. Furthermore, baffle 76 may be a single annulus as shown in FIG. 1, 2, and 3, or it may consist of two or more baffles at various distances from aperture 36. If baffle 76 is multiple, each baffle element may be provided similarly with means for independently varying its potential with respect to aperture 36, and with respect to time. The bare trigger wire 60 is centered in the baffle hole 78 and extends up through it toward the main electrode cathode aperture 36.

As noted above and described previously, the electrons and light from hot filament 70 produces a discharge at the ceramic sheath/trigger-wire interface. Discharge is made easier by the field intensification at the dielectric discontinuity 66 and by secondary electron multiplication across the ceramic surface as well.

Figure 3A:
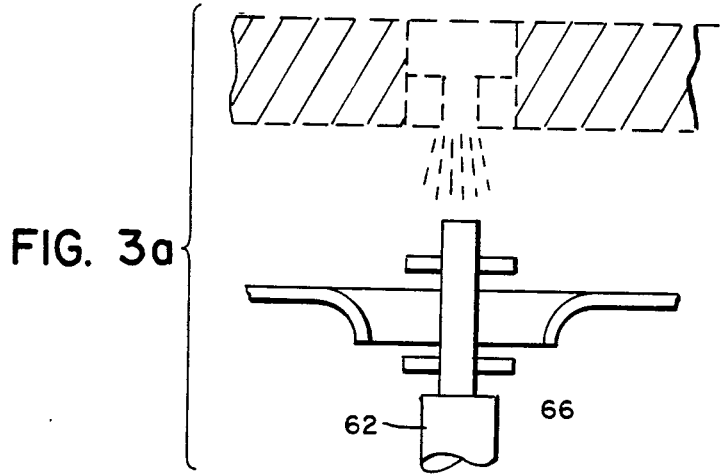
FIG. 3A is a detailed view of an alternate embodiment of the trigger electrode shown in FIG. 3.

The surface discharge at junction 66 in turn enhances a field intensified discharge at the very tip of the trigger wire 60. As indicated, the tip is located about 3 mm away from the junction discharge site in a position where it can "see" the main electrode cathode aperture 36. This tip is shielded from filaments 70 by baffle lip 80 and by an optional small disk or disks (see FIG. 3A) mounted on wire 60 in the vicinity of lip 80. These features serve to keep material evaporated by the main discharge from the apertures 26, 36 off the insulator 62 and away from the dielectric discontinuity 66, and to prevent forward hold-off failure.

In operation, at higher pressures, i.e. in excess of 200 microns when trigger wire 60 is supplied with a high voltage trigger pulse, an intense beam of plasma resembling a flame appears at the tip of wire 60, spraying charges into the nearby space. These appear to travel in straight lines, and they excite fluorescence of the tube wall. In the main electrode cathode space, they can be observed to illuminate the cathode hole as viewed by means of a window over the cathode aperture. Beam formation occurs at breakdown voltages of only several hundred volts. The shape of the beam begins to change as pressure increases to approximately 350 microns. The beam of plasma can also be steered by aiming the wire 60 and surrounding baffle. In the preferred embodiment the beam is directed at the cathode aperture 36 where, under some conditions, it promotes rapid and complete firing of the thyratron.

Figure 5:
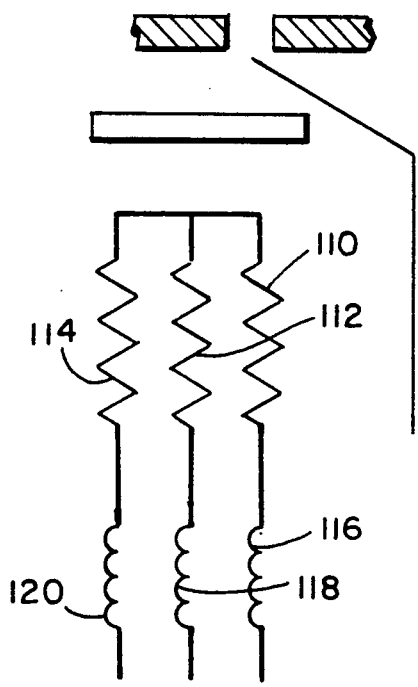
FIG. 5 is a schematic diagram of a specific embodiment of the auxiliary discharge emitter of FIG. 4.
Figure 6:
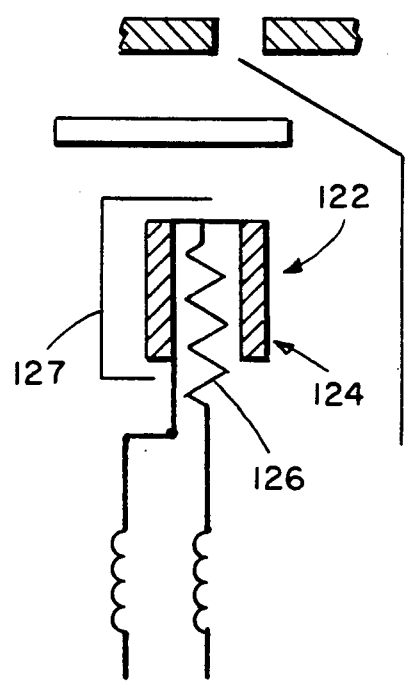
FIG. 6 is a schematic diagram of an alternate embodiment of the auxiliary discharge emitter of FIG. 4.

Referring now to FIG. 4 there is shown therein, a presently preferred embodiment of an auxiliary discharge electrode means for use in the present invention. As shown therein, the electrode means is an emitter 84 spaced a predetermined distance from a trigger electrode 86. Emitter 84 and electrode 86 are located within a cathode enclosure 88 having a cathode aperture 90 located above the emitter and trigger electrode. A baffle 92 extends from the wall of enclosure 88 above emitter 84 and beyond aperture 90 and shields the emitter from a direct "line of sight" to aperture 90 and isolates the emitter from the main thyratron conduction current. Baffle 92 may be connected directly to enclosure 88 as shown in FIG. 4, or it may be isolated as shown in FIGS. 5 and 6 so that its potential may be adjusted relative to that of enclosure 88 and cathode aperture 90. Furthermore, baffle 92 may consist of two or more independent baffle elements positioned at various distances from aperture 90 and provided with means for varying their potentials with respect to aperture 90 and with respect to time.

Trigger electrode 86 includes a tungsten trigger wire whisker 94 extending upwardly at an angle to a point above baffle 92 and below aperture 90 such that there is a first direct "line of sight" from whisker 94 to emitter 84 and a second direct "line of sight" from whisker 94 to aperture 90. Electrical lead (or leads) connects electric power through vacuum feedthrough 98 to emitter 84. The emitter is shown very schematically here; a drawing of the actual device would have to show at least one more lead (preferably 2 leads) for the heater, and a separate lead for connection to the emitter itself (which last is the only lead indicated on the present drawing). Electrical lead 100 conducts electric power through vacuum feed through 102 to whisker 94. A ceramic sheath 104 surrounds electrical lead 100 and a trigger ground return sleeve 106 in turn surrounds sheath 104.

When electrical lead 100 is pulsed positive to emitter 84, electrons generated by the emitter are attracted to electrode 94 causing the ceramic flashover surface 108 to be charged thereby promoting a breakdown and discharge between electrode 94 and sleeve 106. Discharge at surface 108 causes electrode 94 to produce a glow discharge at much lower voltages and much sooner than would otherwise occur at the typical pressures being used, namely 125-250 millitorrs. The glow discharge at electrode 94 in turn triggers the main thyratron conduction discharge through aperture 90.

Two different embodiments of emitters are shown in FIGS. 5 and 6. In the first embodiment, the emitter includes a plurality of directly heated filaments 110, 112, 114. Protective impedances 116, 118, 120 are connected to the respective filaments. An emitter of this type uses very low power and requires essentially no warm-up. DC power is supplied to the filaments, it having been determined that using AC or DC with ripple causes unacceptable AC modulation or ripple frequency modulation of the anode delay time, i.e. delay of the main discharge to the anode.

In the second embodiment, an indirectly heated cathode 122 is shown. In this embodiment an oxide coated or impregnated tungsten cathode 124 is used. Heater filament 126 provides the heat source for the cathode 124. A thermal heat shield 127 is also provided. As an alternate to a tungsten cathode, a fluorescent lamp cathode can also be used in this application. Using an indirectly heated cathode, problems due to AC or ripple frequency modulation are eliminated but the tradeoff is the need for longer warm-up times and greater amounts of heater power.

Being compact and small, the trigger according to the present invention makes miniaturized thyratron switch tubes possible. The diameters of present day thyratron switches are primarily governed by the size of their cathodes. Elimination of large hot cathodes removes the need for a source of heat dissipation, and reduced tube envelope diameter simplifies extraction of heat resulting from other heat sources of the thyratron during operation.

Thus, the present invention is characterized as an electrical triggering means for a cold cathode thyratron in which a small thermionic auxiliary emitter is used to promote the prompt formation of a glow discharge between trigger elements at relatively low trigger voltages (of the order of 3-5 kilovolts), in a relatively short time (delay time of some small fraction of a microsecond, jitter of a few nanoseconds or less), which glow discharge is in turn capable of prompt triggering of the main thyratron discharge.

What is claimed is:

1. A trigger for a high power electronic pseudospark thyratron switch, comprising:
   an evacuated envelope back filled with a selected elemental gas at a predetermined pressure;
   an anode having a first aperture located within the envelope;
   a cathode having a second aperture located within the envelope at a predetermined distance from the anode, said anode and cathode being disposed opposite each other, with said first and second apertures in alignment;
   an elongated trigger electrode located within the envelope such that electrical discharges therefrom will inject electrons through one of said apertures into the space between the anode and cathode;
   insulating means disposed about and enclosing the trigger electrode from a point a predetermined distance below the tip of said electrode to the point where the trigger electrode electrical connection passes through the envelope;
   auxiliary discharge electrode means including a filament for providing surface flashover across said insulating means when a trigger pulse is applied to the trigger electrode; and
   means for supplying electrical power to said filament.

2. A thyratron switch according to claim 1 including means for supplying an electrical pulse to the trigger electrode with voltage sufficient to promote insulator flashover and to further promote electrical disturbance in the space between the anode and cathode by means of electrons emitted from the electrode in response to ultraviolet light, electrons and excited particles created by the flashover.

3. A thyratron switch according to claim 2 including baffle means for preventing electrons from said filament from impinging directly on the first and second apertures and for preventing the thyratron plasma discharge from impinging directly on the trigger electrode.

4. A thyratron switch according to claim 3 including means for controlling the electrical potential of said baffle means to enhance the isolation of said filament from the space between anode and cathodes.

5. A thyratron switch according to claim 4 including means for electrically connecting the cathode to zero electrical potential.

6. A thyratron switch according to claim 4 including means for electrically connecting the cathode to a predetermined electrical potential.

7. A thyratron according to claim 4 wherein the predetermined gas pressure is selected such that high voltage breakdown is prevented at relatively small values of the product of pressure times distance.

8. A thyratron according to claim 7 wherein the predetermined distance between anode and cathode is selected such that the product of pressure time distance is relatively small thereby permitting a relatively high electrical potential difference to be sustained between the anode and cathode in the absence of electrical disturbance in the space between anode and cathode.

9. A thyratron according to claim 8 wherein said insulating means is a ceramic sheath surrounding and enclosing the trigger electrode, the point of junction between the innermost point of the sheath and the electrode providing the site of a surface discharge over said sheath.

10. A thyratron according to claim 9 wherein said filament is disposed about and spaced from said sheath and trigger electrode for promoting said surface discharge by emitting electrons from said filament.

11. A thyratron according to claim 10 wherein the filament is coated with a materials having a low work function to enhance the electron emitting capability of the filament means.

12. A thyratron according to claim 9 wherein said auxiliary discharge electrode means comprises an auxiliary emitter located within the envelope and spaced a predetermined distance from the sheath and trigger electrode for promoting trigger firing by means of electrons generated by said emitter means.

13. A thyratron according to claim 9 wherein the auxiliary discharge electrode means comprises at least one directly heated filament.

14. A thyratron according to claim 12 wherein the auxiliary emitter comprises an indirectly heated cathode.

15. A thyratron according to claim 10 including means for electrically biasing said filament means with respect to the cathode.

16. A thyratron according to claim 15 including means for limiting the current which can be drawn through the filament during the main discharge between anode and cathode in order to prevent damage thereto.

17. A thyratron according to claim 14 wherein the means for controlling the electrical potential of the baffle means comprises an electrical connection to the cathode.

* * * * *